(12) United States Patent
Oi

(10) Patent No.: US 10,476,472 B2
(45) Date of Patent: Nov. 12, 2019

(54) QUARTZ CRYSTAL DEVICE

(71) Applicant: NIHON DEMPA KOGYO CO., LTD., Tokyo (JP)

(72) Inventor: Yuki Oi, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 15/905,830

(22) Filed: Feb. 27, 2018

(65) Prior Publication Data

US 2018/0254762 A1 Sep. 6, 2018

(30) Foreign Application Priority Data

Mar. 1, 2017 (JP) .................................. 2017-037960

(51) Int. Cl.
| | |
|---|---|
| *H03H 9/02* | (2006.01) |
| *H03H 9/10* | (2006.01) |
| *H03B 5/32* | (2006.01) |
| *H03L 1/02* | (2006.01) |
| *H03H 9/19* | (2006.01) |

(52) U.S. Cl.
CPC .......... *H03H 9/02133* (2013.01); *H03B 5/32* (2013.01); *H03H 9/02023* (2013.01); *H03H 9/02102* (2013.01); *H03H 9/10* (2013.01); *H03H 9/19* (2013.01); *H03L 1/028* (2013.01)

(58) Field of Classification Search
CPC .................................................. H03H 9/02023
USPC ............................................................. 331/68
See application file for complete search history.

(56) References Cited

U.S. PATENT DOCUMENTS

2012/0313721 A1* 12/2012 Kohda ................. H03H 9/0514
331/158

FOREIGN PATENT DOCUMENTS

JP      2009253883      10/2009

* cited by examiner

*Primary Examiner* — Joseph Chang
(74) *Attorney, Agent, or Firm* — JCIPRNET

(57) ABSTRACT

A quartz crystal device includes a quartz-crystal vibrating piece, a container, and a pedestal. The container houses the quartz-crystal vibrating piece. The pedestal is located between the quartz-crystal vibrating piece and the container for connecting and fixing the quartz-crystal vibrating piece to the container. The pedestal is configured with a crystal. The pedestal is fixed to the container at three places of a first fixation point, a second fixation point, and a third fixation point in a plan view. The first fixation point, the second fixation point, and the third fixation point are configured so as to become positions where an inner center, an outer center, or a gravity center of a triangle formed by connection of the first, second and third fixation points and a gravity center of the pedestal match.

6 Claims, 7 Drawing Sheets

QUARTZ CRYSTAL DEVICE

CROSS-REFERENCE TO RELATED APPLICATIONS

This application is based on and claims priority under 35 U.S.C. § 119 to Japanese Patent Application No. 2017-037960, filed on Mar. 1, 2017, the entire content of which is incorporated herein by reference.

TECHNICAL FIELD

This disclosure relates to a quartz crystal device that includes a pedestal configured with a crystal.

DESCRIPTION OF THE RELATED ART

Various pieces of electronic equipment such as a mobile phone and a personal computer often use a quartz crystal device such as a crystal unit or a crystal controlled oscillator for selecting and controlling a frequency, or for similar purpose.

On the other hand, to such a quartz crystal device, there is growing requests for improvement relative to frequency stability, vibration resistance, impact resistance, and similar property. As one of countermeasures, for example, Japanese Unexamined Patent Application Publication No. 2009-253883 discloses a quartz crystal device that includes a quartz-crystal vibrating piece, a container housing the quartz-crystal vibrating piece, and a pedestal that is located between them and configured with a crystal. Furthermore, it discloses a structure where the pedestal and the container are fixed by a conductive adhesive at three places. In this quartz crystal device, since a stress exerted on the quartz-crystal vibrating piece from the container can be reduced by the pedestal configured with a crystal, the pedestal and the container are fixed with one another at three places, the pedestal and the container are made of an identical material, and similar feature, the quartz crystal device has a feature of facilitated improvement in properties.

However, while indicating the structure of fixing the pedestal, which is configured with a crystal, to the container at the three places, Japanese Unexamined Patent Application Publication No. 2009-253883 provides neither specific description nor suggestion on a fixation place. To extract original performance of a pedestal configured with a crystal, an appropriate arrangement or similar condition of a fixation position of a pedestal to a container is necessary.

A need thus exists for a quartz crystal device which is not susceptible to the drawback mentioned above.

SUMMARY

According to an aspect of this disclosure, there is provided a quartz crystal device. The quartz crystal device includes a quartz-crystal vibrating piece, a container, and a pedestal. The container houses the quartz-crystal vibrating piece. The pedestal is located between the quartz-crystal vibrating piece and the container for connecting and fixing the quartz-crystal vibrating piece to the container. The pedestal is configured with a crystal. The pedestal is fixed to the container at three places of a first fixation point, a second fixation point, and a third fixation point in a plan view. The first fixation point, the second fixation point, and the third fixation point are configured so as to become positions where an inner center, an outer center, or a gravity center of a triangle formed by connection of the first, second and third fixation points and a gravity center of the pedestal match.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

Figure 1A:
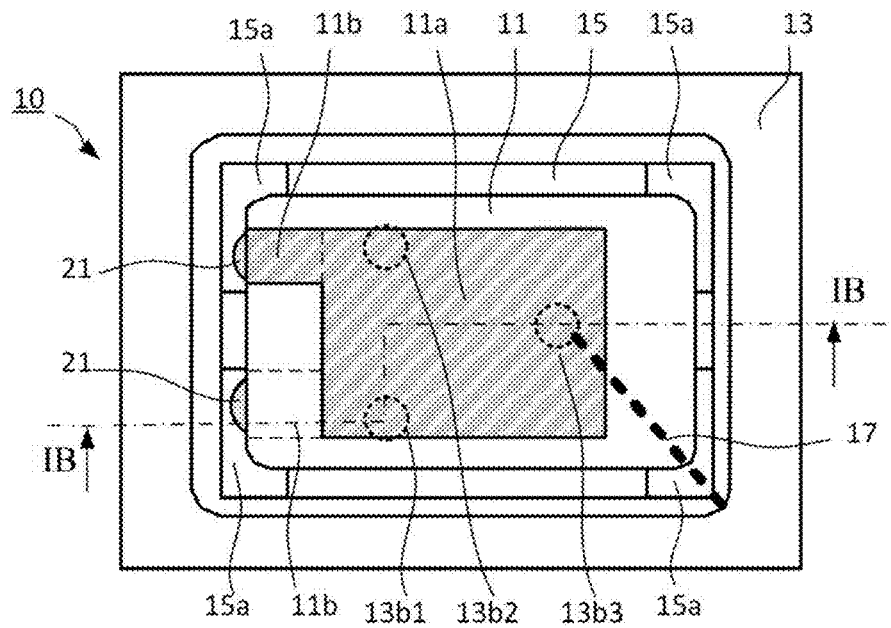
FIG. 1A, FIG. 1B, and FIG. 1C are drawings for illustrating a quartz crystal device 10 according to an embodiment.

The following describes an embodiment of the disclosure with reference to the accompanying drawings. Each drawing used in the description is merely illustrated schematically for understanding this disclosure. In each drawing used in the description, like reference numerals designate corresponding or identical elements, and therefore such elements may not be further elaborated here. Shapes, dimensions, materials, and a similar factor described in the following embodiment are merely preferable examples within the scope of this disclosure. Therefore, this disclosure is not limited to only the following embodiment.

1. Embodiment of Crystal Unit

Figure 1B:
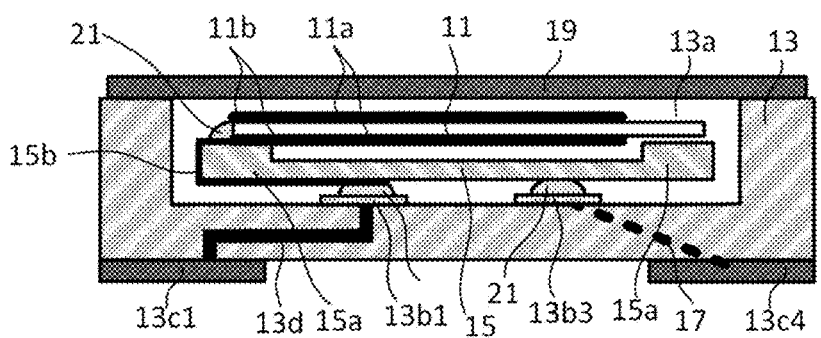
Figure 1C:
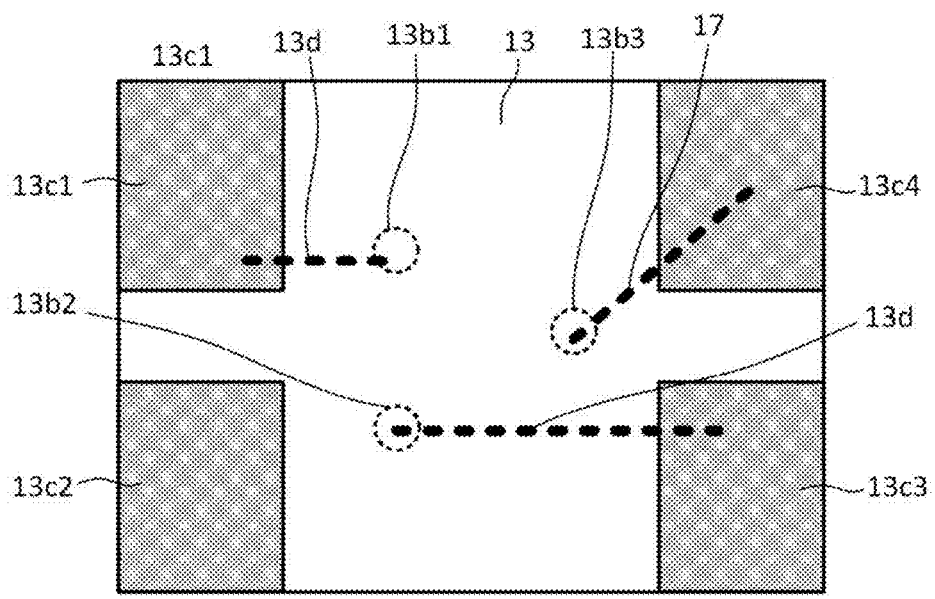
Figure 2A:
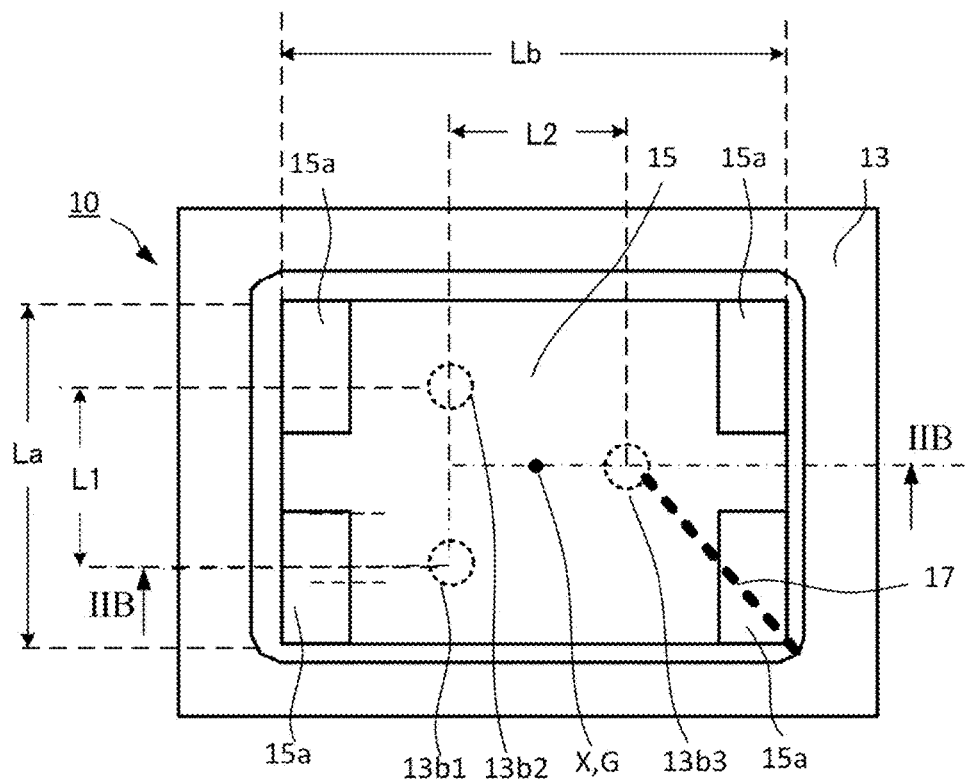
FIG. 2A and FIG. 2B are drawings for illustrating a relationship between a pedestal and first to third fixation points.
Figure 2B:
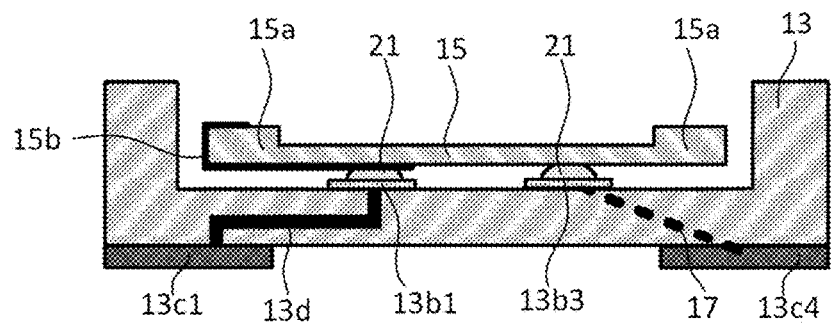

FIG. 1A, FIG. 1B, and FIG. 1C are drawings for illustrating a quartz crystal device 10 according to an embodiment. In particular, FIG. 1A is a plan view illustrating the quartz crystal device 10, FIG. 1B is a cross-sectional view taken along the line IB-IB in FIG. 1A, and FIG. 1C is a bottom view. FIG. 2A and FIG. 2B are drawings illustrating fixation points between a pedestal 15 and a container 13. In particular, FIG. 2A is a plan view that corresponds to FIG. 1A, FIG. 2B is a cross-sectional view that corresponds to FIG. 1B, and both the drawings illustrate a state where a quartz-crystal vibrating piece 11 is removed. This quartz crystal device 10 corresponds to the embodiment as the crystal unit.

The quartz crystal device 10 includes the quartz-crystal vibrating piece 11, the container 13, the pedestal 15, a heat conduction member 17, and a lid member 19.

The quartz-crystal vibrating piece 11 employs an SC cut crystal element in this embodiment. Further, the SC cut crystal element has a rectangular shape with a long side in a direction along a Z'-axis of crystal as a plane shape. The quartz-crystal vibrating piece 11 includes excitation electrodes 11a on its respective front and back surfaces and extraction electrodes 11b extracted from these excitation electrodes 11a to a side of one side of the quartz-crystal vibrating piece 11.

The container 13 houses the quartz-crystal vibrating piece 11, and in a case of this example, has a depressed portion 13a that contains the quartz-crystal vibrating piece 11. The container 13 can be configured with, for example, a ceramic container. Further, the container 13 includes connection pads 13b1, 13b2, and 13b3 for connecting the pedestal 15 to a bottom surface of the depressed portion 13a, in a specified positional relationship, which will be described later. Furthermore, the container 13 includes mounting terminals (also referred to as external terminals) 13c1, 13c2, 13c3, and 13c4 at four corners on its outer bottom surface, namely its backside surface, and includes via-wirings 13d in its inside. The connection pads (also referred to as fixation pads) 13b1 and 13b2 and the external terminals 13c1 and 13c3 are connected by the via-wirings 13d, in a specified relationship. Among the four external terminals 13c1, 13c2, 13c3, and 13c4, two of them are used as terminals for the quartz-crystal vibrating piece 11, one of them is used as a connection terminal for the heat conduction member 17, and the remaining one is used, for example, as a GND terminal or similar terminal.

The pedestal 15 is fixed to the connection pads 13b1 to 13b3 of the container 13 at specified positions (that will be described in detail later) on its one surface, and fixes the quartz-crystal vibrating piece 11 at specified positions on its opposite surface. The pedestal 15 in this case has a rectangular shape as a plane shape and has dimensions slightly larger than the quartz-crystal vibrating piece 11. In this case, the pedestal 15 is configured with an AT-cut crystal element. Further, the pedestal 15 is configured with the AT-cut crystal element having a long side in a direction along a Z'-axis of crystal. The pedestal 15 has extruding parts 15a at four corners of a surface where the quartz-crystal vibrating piece 11 is fixed. The quartz-crystal vibrating piece 11 is connected and fixed to the pedestal 15 by conductive adhesives 21 at positions that are both ends of its one side and the extruding parts 15a of the pedestal 15. That is, the quartz crystal device 10 is a crystal unit having a cantilever support structure. The quartz-crystal vibrating piece 11 and the pedestal 15 are arranged such that mutual Z'-axes of crystal face an identical direction.

The pedestal 15 includes wirings 15b (see FIG. 1B and FIG. 2B) for connecting the extraction electrodes 11b of the quartz-crystal vibrating piece 11 to the connection pads 13b1 and 13b2 of the container 13. The heat conduction member 17 (that will be described in detail in an embodiment of an oscillator described later) is located to connect the third fixation point 13b3 to the external terminal 13c4.

Here, one of features of the disclosure is to set fixation positions of the pedestal 15 to the container 13 as specified positions. That is, as particularly illustrated in FIG. 2A, the disclosure fixes the pedestal 15 to the container 13 at three places of the first fixation point 13b1, the second fixation point 13b2, and the third fixation point 13b3, in a plan view. Further, the first fixation point 13b1 to the third fixation point 13b3 are set such that positions of a center X of a triangle formed by connecting the first fixation point 13b1, the second fixation point 13b2, and the third fixation point 13b3 and a gravity center G of the pedestal 15 match. Here, as well known, there are several kinds of centers in a triangle, and the five centers of an inner center, an outer center, a gravity center, an orthocenter, and an excenter are known as representatives. Focusing on the above-described five centers is preferable as a way of determining the fixation points of the pedestal 15 to the container 13 compared with a case of setting the positions of the first fixation point 13b1 to the third fixation point 13b3 relative to the pedestal 15 without any consideration. Furthermore, from the purpose of the disclosure, it is preferred that the first fixation point 13b1 to the third fixation point 13b3 are set such that the positions of the inner center, the outer center, or the gravity center of the triangle formed by connecting the first fixation point 13b1, the second fixation point 13b2, and the third fixation point 13b3 and the gravity center of the pedestal 15 match. It is more preferred that the first fixation point 13b1 to the third fixation point 13b3 are set such that the positions of the mutual gravity centers match.

For convenience of explanation, here, the description is given of respective centers of the three connection pads 13b1, 13b2, and 13b3, which are located in the container 13, as the centers of the first fixation point 13b1 to the third fixation point 13b3. That is, placing the pedestal 15 to the container 13 by aligning to the container 13 with a specified relationship fixes the pedestal 15 relative to the container 13 in an arrangement that satisfies a relationship between the above-described center X (as a preferable example, the inner center, the outer center, or the gravity center) and the gravity center G and a dimensional relationship. Matching of the center X of the first fixation point 13b1 to the third fixation point 13b3 and the gravity center G of the pedestal 15 includes a slight displacement due to a relationship such as manufacturing accuracy. For example, considering current mounting accuracy or similar accuracy of an automatic mounting apparatus, a displacement of up to about ±0.2 mm is acceptable.

Further, in the quartz crystal device 10 according to the embodiment, as illustrated in detail in FIG. 2A and FIG. 2B, the first fixation point 13b1 to the third fixation point 13b3 are set such that a line segment (hereinafter referred to as a first line segment) that connects the first fixation point 13b1 and the second fixation point 13b2 and a short side La of the pedestal 15 are parallel, and a second line segment that is a perpendicular line connecting the first line segment and the third fixation point 13b3 and a long side Lb of the pedestal 15 are parallel. Furthermore, the first fixation point 13b1 to the third fixation point 13b3 are set such that a distance L1 indicated by the first line segment becomes a specified relationship relative to the short side La of the pedestal 15 and a distance L2 indicated by the second line segment becomes a specified relationship relative to the long side Lb of the pedestal 15.

The lid member 19 seals the container 13 that has mounted the pedestal 15 and the quartz-crystal vibrating piece 11. The lid member 19 may have any configuration corresponding to a sealing method. For example, the lid member 19 is a metallic or ceramic lid member.

2. Simulation Result

Next, to confirm the effects of the disclosure, a simulation model that is based on the structure illustrated by using FIG. 1A, FIG. 1B, FIG. 1C, FIG. 2A, and FIG. 2B is made, and a simulation by a finite element method is performed. Specifically, the simulation was performed with models that were assumed as follows: the pedestal 15 is an AT cut crystal element with a length of the short side La=3.1 mm and a length of the long side Lb=4.9 mm; the quartz-crystal vibrating piece 11 is a model of an SC cut crystal element with a short-side length of 3 mm, a long-side length of 4.5 mm, and a specified oscillation frequency; and the container 13 is a ceramic package with a size of, what is called, 7050.

Note, however, that the used simulation model is, as described above, a model as follows: the first line segment (the portion corresponding to L1 in FIG. 2A), which is a line segment connecting the first fixation point 13b1 and the second fixation point 13b2, and the short side (the portion corresponding to La in FIG. 2A) that is a first side of the pedestal 15 are parallel; and the second line segment (the portion corresponding to L2 in FIG. 2A), which is the perpendicular line of the first line segment and the third fixation point 13b3, is parallel with the long side (the portion corresponding to Lb in FIG. 2A) that is a second side of the pedestal 15. Further, by focusing on the gravity center of the triangle as the center X of the triangle formed by connecting the first fixation point 13b1 to the third fixation point 13b3, the model is made such that this gravity center and the gravity center G of the pedestal 15 match. Furthermore, with regard to the first fixation point 13b1 to the third fixation point 13b3, the model is a model of an isosceles triangle, which includes an equilateral triangle, with the first line segment as a bottom side.

Figure 3A:
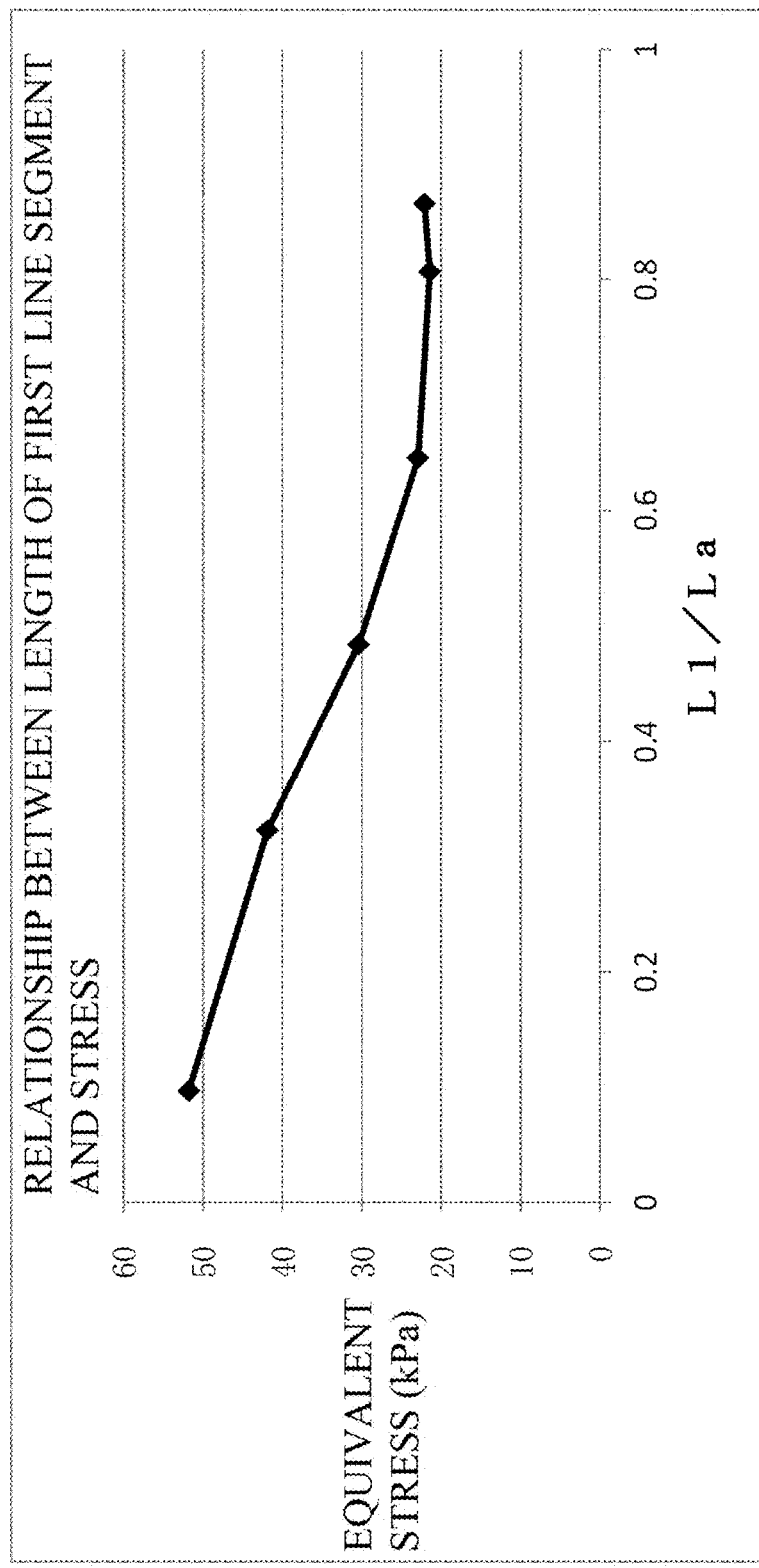
FIG. 3A and FIG. 3B are diagrams for illustrating simulation results of a preferable, dimensional relationship between the pedestal and the first to third fixation points.
Figure 3B:
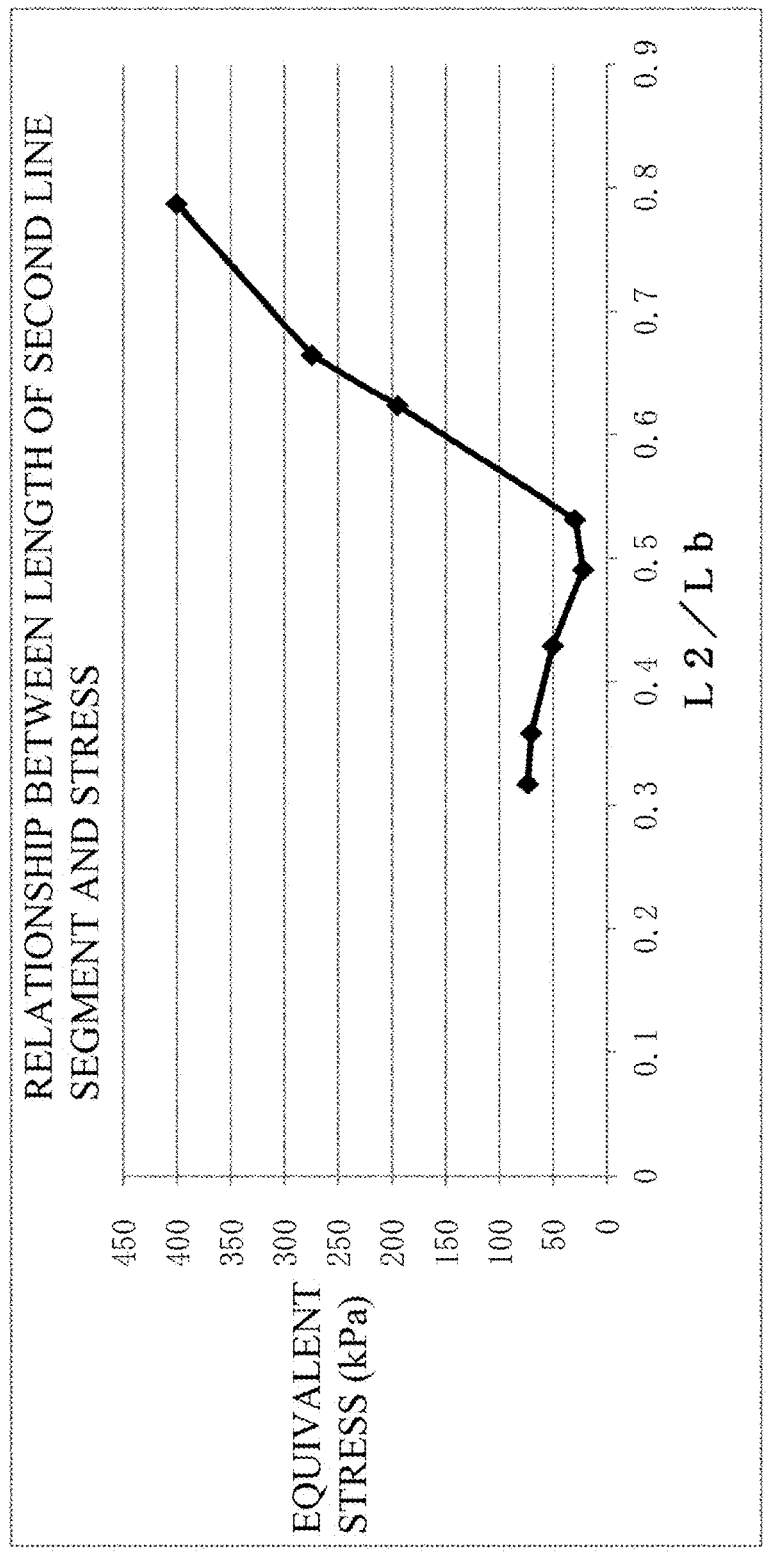

In such model, stresses generated in the quartz-crystal vibrating piece 11 were obtained in each of the following cases: when the length L1 of the first line segment was changed to several values in a state where the length L2 of the second line segment, which is illustrated in FIG. 2A, was fixed to a certain value; and when the length L2 of the second line segment was changed to several values in a state where the length L1 of the first line segment was fixed to a certain value. The obtained stresses are, in this case, average values (hereinafter abbreviated as an equivalent stress) of equivalent stresses at the portions opposed to the excitation electrodes 11a of the quartz-crystal vibrating piece 11. The simulation conditions and the equivalent stresses generated in the conditions are indicated in the following table 1 and table 2. These tables indicate ratios of the distances between the fixation points to the side lengths of the pedestal 15, namely, L1/La and L2/Lb. The relationship between L1/La and the equivalent stresses is also illustrated in FIG. 3A, and the relationship between L2/Lb and the equivalent stresses is also illustrated in FIG. 3B. In both the drawings, a horizontal axis indicates L1/La or L2/Lb, and a vertical axis indicates the equivalent stress.

TABLE 1

| La (mm) | L1 (mm) | L1/La | Equivalent stress (kPa) |
|---|---|---|---|
| 3.1 | 0.3 | 0.097 | 51.81 |
| 3.1 | 1 | 0.323 | 41.90 |
| 3.1 | 1.5 | 0.484 | 30.40 |
| 3.1 | 2 | 0.645 | 22.92 |
| 3.1 | 2.5 | 0.806 | 21.45 |
| 3.1 | 2.685 | 0.866 | 22.11 |

TABLE 2

| Lb (mm) | L2 (mm) | L2/Lb | Equivalent stress (kPa) |
|---|---|---|---|
| 4.9 | 1.555 | 0.317 | 73.75 |
| 4.9 | 1.755 | 0.358 | 70.33 |
| 4.9 | 2.105 | 0.430 | 50.12 |
| 4.9 | 2.405 | 0.491 | 22.11 |
| 4.9 | 2.605 | 0.532 | 29.36 |
| 4.9 | 3.055 | 0.623 | 195.20 |
| 4.9 | 3.255 | 0.664 | 274.30 |
| 4.9 | 3.855 | 0.787 | 400.21 |

From FIG. 3A, it is seen that when L1/La is $0.5 \leq L1/La \leq 1$, the equivalent stress is ensured to be equal to or less than 30 kPa. It is preferable to be $0.6 \leq L1/La \leq 0.9$, and in that case, the equivalent stress is ensured to be equal to or less than 25 kPa. From FIG. 3B, it is seen that when L2/Lb is $0.3 \leq L2/Lb \leq 0.6$, the equivalent stress is ensured to be equal to or less than 150 kPa. It is preferable to be $0.3 \leq L2/Lb \leq 0.55$, and in that case, the equivalent stress is ensured to be equal to or less than 75 kPa. Since the equivalent stresses that satisfy these inequalities are preferable for improving the property of the quartz crystal device, it is seen that it is preferred to select the fixation points of the pedestal 15 so as to satisfy $0.5 \leq L1/La \leq 1$ and $0.3 \leq L2/Lb \leq 0.6$, and it is more preferred to selecte so as to satisfy $0.6 \leq L1/La \leq 0.9$ and $0.3 \leq L2/Lb \leq 0.55$.

Figure 4:
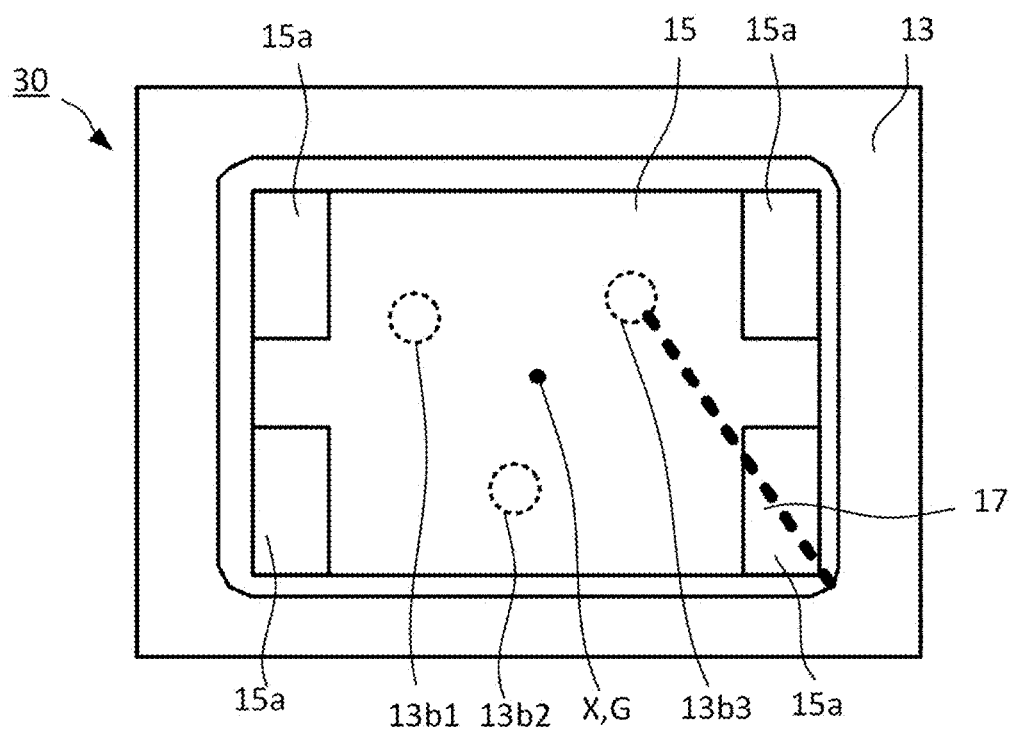
FIG. 4 is a drawing for illustrating a quartz crystal device 30 according to another embodiment.

The disclosure makes a point that the first fixation point 13b1, the second fixation point 13b2, and the third fixation point 13b3 are located so as to be at the positions where the center X of them and the gravity center G of the pedestal 15 match, and are located such that the first line segment and the second line segment satisfy a specified relationship with the dimensions of the pedestal 15. Thus, as the scope of the disclosure, as illustrated in FIG. 4, the disclosure also includes the case where the first fixation point 13b1 to the third fixation point 13b3 is in an arrangement rotated in the plane with the center X as a rotational center, relative to the state in FIG. 1A, FIG. 1B, and FIG. 1C, and satisfy the above-described relationship. Note, however, that the arrangement where the first line segment and the second line segment become the specified relationship relative to the long side Lb and the short side La of the pedestal 15, which are described by using FIG. 1A, FIG. 1B, and FIG. 1C, is preferable because there are advantages of facilitated design of a container, facilitated design of fixation points, and similar design.

3. Embodiment of Oscillator

Figure 5:
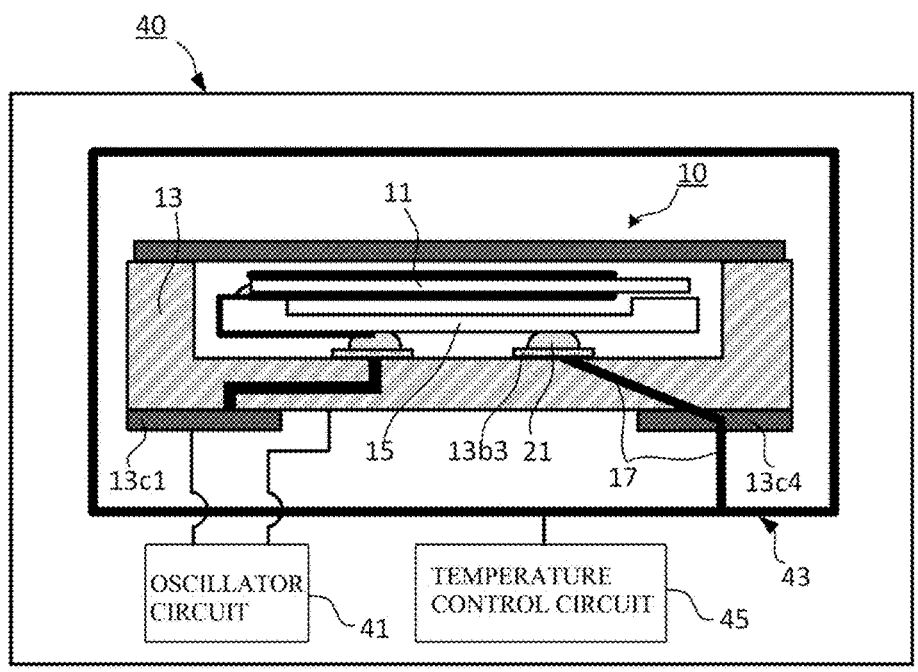
FIG. 5 is a drawing for illustrating a quartz crystal device 40 according to an embodiment as an oscillator.

Next, the following describes an example where the disclosure is applied to a quartz crystal device as an oscillator and further, the fixation points fixing a pedestal to a container is effectively used for other applications. FIG. 5 is an explanatory drawing of the example, and components as the oscillator are added to a cross-sectional view that corresponds to FIG. 1B. In FIG. 5, among the reference numerals that designate the respective components, the reference numerals unnecessary for describing this embodiment are omitted.

A quartz crystal device 40 according to this embodiment includes an oscillator circuit 41 for the quartz-crystal vibrating piece 11 and a temperature control circuit 45 with a heater 43 that heats the container 13, which houses the quartz-crystal vibrating piece 11, in addition to the configuration of the quartz crystal device 10 according to the first embodiment. Further, the heat conduction member 17 is included to connect the fixation point that is not connected to the quartz-crystal vibrating piece 11 among the first fixation point 13b1, the second fixation point 13b2, and the third fixation point 13b3, which have been described above, in this case, the heat conduction member 17 is included to connect the third fixation point 13b3 to the heater 43. The heat conduction member 17 can be configured, for example, with a metallized material, which is buried in the package when a ceramic package as the container 13 is manufactured, and a wiring on the substrate, which is connected to the external terminal 13c4 of the container 13.

In the case of the quartz crystal device 40 as the oscillator, heat of the heater 43 is conducted to the pedestal 15 via the heat conduction member 17 and the third fixation point 13b3, and radiant heat from the pedestal 15 is exerted on the quartz-crystal vibrating piece 11. Consequently, this ensures, for example, a crystal controlled oscillator that has an excellent heat response to a quartz-crystal vibrating piece as well as a temperature-compensation-type crystal controlled oscillator. Therefore, this ensures obtaining both of the effect of a first aspect by setting the fixation points of the pedestal with specified conditions and the effect of a second aspect of having an excellent heat conduction.

4. Other Embodiments

While the above-described embodiment has the configuration where the pedestal has the extruding part, the configuration of the pedestal is not limited to this. While the configuration where the quartz-crystal vibrating piece is supported by a cantilever has been indicated, the disclosure can be applied also to a case of a doubly supported structure that supports the quartz-crystal vibrating piece at its two opposing sides. While the description has been given of the example where the container having the depressed portion is used as a container, and the plate-shaped lid member is used as a lid member, a case that uses a plate-shaped container and a cap-shaped lid member as a lid member is applicable. While the description has been given of the example where the SC cut vibrating piece is used as a quartz-crystal vibrating piece, and the AT-cut crystal element is used as a pedestal, a combination of cut of a pedestal and a quartz-crystal vibrating piece is not limited to this. While the description has been given of the example where the pedestal is slightly larger than the quartz-crystal vibrating piece, it is possible to change a size relationship of a pedestal and a quartz-crystal vibrating piece corresponding to design.

A second aspect of this application is a quartz crystal device as a crystal controlled oscillator with a constant-temperature function. The quartz crystal device includes: a oscillator circuit for the quartz-crystal vibrating piece; and a temperature control circuit with a heater that heats the container housing the quartz-crystal vibrating piece, in addition to the configuration of the first aspect, and includes a heat conduction member that connects the fixation point, which is unconnected to the quartz-crystal vibrating piece among the first fixation point, the second fixation point, and the third fixation point, to the heater.

With the quartz crystal device according to the first aspect of this application, since the pedestal is fixed to the container at the specified positions focused on the inner center, the outer center, or the gravity center of the triangle, it is possible to stably fix the pedestal to the container compared with the case other than that. Therefore, since the quartz crystal device with the original feature of the pedestal utilized can be obtained, this ensures the quartz crystal device as a crystal unit that has reduced influence of a stress to the quartz-crystal vibrating piece from the pedestal and is excellent in impact resistance and vibration resistance.

With the second aspect of this application, since the specified heat conduction member is included in addition to the configuration of the first aspect, this ensures conducting the heat of the heater to the quartz-crystal vibrating piece via any of the first to third fixation points and the pedestal. Consequently, due to improvement of the heat response of the quartz-crystal vibrating piece, this ensures the quartz crystal device as the crystal controlled oscillator that is excellent in a temperature compensation characteristic in addition to the effects of the first aspect.

The principles, preferred embodiment and mode of operation of the present invention have been described in the above specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A quartz crystal device, comprising:
   a quartz-crystal vibrating piece;
   a container that houses the quartz-crystal vibrating piece; and
   a pedestal, located between the quartz-crystal vibrating piece and the container for connecting and fixing the quartz-crystal vibrating piece to the container, the pedestal being configured with a crystal, wherein
   the pedestal is fixed to the container at three places of a first fixation point, a second fixation point, and a third fixation point in a plan view,
   the first fixation point, the second fixation point, and the third fixation point are configured so as to become positions where an inner center, an outer center, or a gravity center of a triangle formed by connection of the first, second and third fixation points and a gravity center of the pedestal match.

2. The quartz crystal device according to claim 1, wherein the pedestal has a square shape as a plane shape, and the first fixation point, the second fixation point, and the third fixation point are located with a following condition relative to the pedestal:
   a first line segment that is a line segment connecting the first fixation point and the second fixation point is parallel with a first side of the pedestal;
   a second line segment that is a perpendicular line of the first line segment and the third fixation point is parallel with a second side orthogonal to the first side of the pedestal;
   a length L1 of the first line segment falls in a specified range relative to a length La of the first side of the pedestal; and
   a length L2 of the second line segment falls in a specified range relative to a length Lb of the second side of the pedestal.

3. The quartz crystal device according to claim 2, wherein the pedestal is an AT-cut crystal element,
   the quartz-crystal vibrating piece is an SC cut crystal element,
   the pedestal and the quartz-crystal vibrating piece are arranged such that identical axes of crystallographic axes of the respective crystals face an identical direction, and
   L1/La as a ratio of L1 to La is $0.5 \leq L1/La \leq 1$, and
   L2/Lb as a ratio of L2 to Lb is $0.3 \leq L2/Lb \leq 0.6$.

4. The quartz crystal device according to claim 2, wherein the quartz-crystal vibrating piece has a square shape as a plane shape, and
   the quartz-crystal vibrating piece is held onto the pedestal at two points of both ends of one side of the quartz-crystal vibrating piece.

5. The quartz crystal device according to claim 2, wherein the pedestal has a rectangular shape, and
   the triangle is an isosceles triangle with the first line segment as a bottom side.

6. A quartz crystal device as an oscillator with a constant-temperature function, comprising:
   the quartz crystal device according to claim 1;
   an oscillator circuit for the quartz-crystal vibrating piece; and a temperature control circuit, including a heater that heats the container housing the quartz-crystal vibrating piece, wherein the quartz crystal device includes a heat conduction member that connects the fixation point unconnected to the quartz-crystal vibrating piece among the first fixation point, the second fixation point, and the third fixation point, to the heater.

\* \* \* \* \*